United States Patent [19]

Hosogi

[11] Patent Number: 5,019,877

[45] Date of Patent: May 28, 1991

[54] FIELD EFFECT TRANSISTOR

[75] Inventor: Kenji Hosogi, Itami, Japan

[73] Assignee: Mitsubishi Denki Kabushiki Kaisha, Japan

[21] Appl. No.: 493,725

[22] Filed: Mar. 15, 1990

[30] Foreign Application Priority Data

Aug. 31, 1989 [JP] Japan ................................ 1-226420

[51] Int. Cl.[5] ........................................ H01L 29/80

[52] U.S. Cl. ........................................ 357/22; 357/15; 357/65; 357/71

[58] Field of Search ............ 357/22 R, 22 A, 22 MD, 357/22 I, 22 J, 22 K, 22 S, 15, 65, 68, 69, 71

[56] References Cited

U.S. PATENT DOCUMENTS 4,794,093 12/1988 Tong et al. ........................ 357/22 R
4,871,687 10/1989 Donzelli ............................ 357/22 J
4,924,289 5/1990 Matsuoka ............................ 357/71

FOREIGN PATENT DOCUMENTS 0166112 1/1986 European Pat. Off. .......... 357/22 R
02203225 12/1986 European Pat. Off. .
025566 6/1987 European Pat. Off. .

OTHER PUBLICATIONS

Itoh et al, "Fabrication of Super . . . Characteristics", Technical Research Report, vol. 88, No. 39, pp. 39–44.

Bastida et al, "Airbridge Gate . . . Circuits", IEEE Trans. on Electron Devices, vol. ED-32, No. 12, 1985, pp. 2754–2759.

*Primary Examiner*—Andrew J. James
*Assistant Examiner*—Sara W. Crane
*Attorney, Agent, or Firm*—Leydig, Voit & Mayer

[57] ABSTRACT

A field effect transistor for microwave and millimeter wave frequencies includes a plurality of feeding points on a gate finger extending on a substrate, an airbridge wiring structure which connects adjacent feeding points with each other, and a gate pad beyond the source and drain electrodes connected with the gate finger through the airbridge. The relatively wide gate connection reduces gate resistance. The gate connection does not cross the source and drain electrodes, reducing capacitance. The reduced resistance and capacitance significantly improve the high frequency noise figure.

8 Claims, 5 Drawing Sheets

6
5
5
3
4
1
2a

F I G .3.
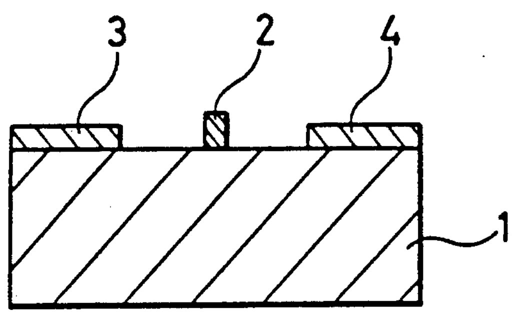

FIELD EFFECT TRANSISTOR

FIELD OF THE INVENTION

The present invention relates to a field effect transistor and, more particularly, to a construction of a control electrode for improving the characteristics of a compound semiconductor field effect transistor which is used at microwave or millimeter wave frequencies.

BACKGROUND OF THE INVENTION

FIG. 3 shows, in cross-section, the main part of a fundamental field effect transistor (hereinafter referred to as an FET). In FIG. 3, reference numeral 1 designates a semiconductor substrate. Conductive layers or insulating layers required for operation are disposed on the substrate 1. A gate electrode 2 is provided to modulate the current flowing from the drain electrode 3 to the source electrode 4 in response to an electrical signal applied thereto.

One use of such an FET is as a low noise amplifier. The characteristic which is most important in this use is the noise figure (hereinafter referred to as NF) which indicates the noise level generated by the FET itself. Since the noise figure deteriorates with an increase in frequency, in order to use the FET at a high frequency, such as in microwave or millimeter wave frequencies, a variety of steps have to be taken. The minimum noise figure ($NF_{min}$) is usually represented by the following formula:

$$NF_{min} = 1 + 2\pi f K_f C_{gs} \sqrt{(R_s + R_g)/gm}$$

where gm is transconductance, $R_s$ is source series resistance, $R_g$ is gate resistance, $C_{gs}$ is gate-to-source capacitance, $K_f$ is a constant, and f is the frequency. As is understood from the above formula, to reduce NF, an increase in the transconductance gm and reductions in the gate-to-source capacitance $C_{gs}$, gate source resistance $R_s$, and gate resistance $R_g$ are required.

To reduce $C_{gs}$ and increase gm, shortening of the gate length ($L_g$) of the device is most effective. In GaAs MESFETs or HEMTs (high electron mobility transistor) which have been recently devised as low noise elements used at microwave frequencies, the $L_g$ is usually quite short, less than 0.5 micron. However, the shortening of $L_g$ invites a reduction of gate cross-sectional area and an increase of $R_g$. For example, in the rectangular gate electrode as shown in FIG. 3, there is a limit to the reduction of NF. The value of $NF_{min}$ at 12 GHz is limited to about 1 dB.

The reduction of $R_g$ is accomplished by production of a T-shaped gate electrode as shown in FIG. 4. In FIG. 4, a gate electrode 2 has a T-shaped cross-section and the gate length $L_g$, which is the length of the gate in contact with the semiconductor substrate 1, is quite narrow, i.e., 0.2 micron. However, the upper portion of the gate electrode has a larger cross-sectional area, thereby suppressing the increase in $R_g$. By such a construction, an element having an $NF_{min}$ of 0.5 to 0.6 dB is realized, showing that the reduction of $R_g$ is quite effective. However, the production of T-shaped gate electrodes requires patterning of $L_g$ to about 0.2 micron, which is not easy.

FIG. 5 shows a plan view of an FET. Reference numeral *2a* designates a gate finger and reference numeral *2b* designates a gate pad. Reference numerals 3 and 4 designate a drain electrode and a source electrode, respectively. Reference numeral 5 designates a feeding point for applying a voltage to the gate finger *2a*. FIGS. 3 and 4 correspond to cross-sections taken along lines III—III and IV—IV in FIG. 5. The external connection is made by adhering a wire to the gate pad *2b*.

Usually, an FET element is constructed as shown in FIG. 5, and a voltage is applied from the two feeding points 5 to the gate finger *2a*, and the length of the gate finger *2a* (the entire gate width is $W_g$) is electrically divided by four, thereby resulting in four unit gate widths, Z, each of which is equal to $W_g/4$. There is a relationship between the gate resistance $R_g$, entire gate width $W_g$, and unit gate width (which is a feeding length from respective feeding points) Z, $$R_g \propto W_g Z^2.$$

For a fixed gate width $W_g$, it is useful to increase the number of feeding points 5 to shorten the unit gate width Z.

By increasing the number of feeding points, the increase of $R_g$ can be suppressed. However, if the number of feeding points is simply increased by a construction as shown in FIG. 5, the number of gate pads *2b* is also increased and many external connections have to be made. Furthermore, an increase in the number of large area gate pads would unfavorably invite an increase in the floating capacitance.

FIGS. 6(*a*) and 6(*b*) show an example in which the number of feeding points is increased without increasing the number of gate pads. FIG. 6(*a*) shows a plan view and FIG. 6(*b*) shows a cross-sectional schematic view taken along line VIb—VIb of FIG. 6(*a*). The number of feeding points is five and the unit gate width Z is $W_g/10$, whereby the $R_g$ is significantly reduced. The gate pad *2b* and the feeding points 5 are connected by the gate wiring 6, and this gate wiring 6 crosses the source electrode 4. Of course, the gate wiring 6 and the source electrode 4 are electrically isolated from each other. However, care has to be taken not to increase the capacitance therebetween. Therefore, the gate wiring 6 is arranged bridging the source electrode 4. Such a structure is usually called an airbridge. Because air has a smaller dielectric constant than an insulating film, such as $SiO_2$, it is possible to reduce the capacitance with an airbridge. The example shown in FIGS. 6(*a*) and 6(*b*) is disclosed in the IEICE Technical Report, Volume 88, Number 60, pages 39–44 (1988) and, in such a construction, an improved $NF_{min}$ of 0.5 to 0.6 dB is realized without using a gate having a T-shaped cross-section.

Another construction shown in FIGS. 7(*a*) and 7(*b*) reduces the gate resistance (European Patent 0,203,225, IEEE Transactions on Electron Devices, Volume ED-32, Number 12, December 1985, pages 2754–2759, "Airbridge Gate FET For GaAs Monolithic Circuits"). This construction employs an airbridge structure similar to that shown in FIG. 5. In this construction, electric power is not supplied at a point but along the entirety of the gate width. When such a construction is used, the $R_g$ can be reduced to a negligible value which is quite useful for low noise properties. However, the gate electrode 6 and the source electrode 4 cross each other over a large area, and eve if an airbridge structure is used, the increase in gate capacitance causes a large problem.

As discussed above, a variety of structures have been proposed to reduce the gate resistance in order to produce a low noise FET. However, the accompanying production processes are very difficult to apply in industrial fabrication or produce an increase of gate capacitance which unfavorably influences the FET characteristics. These problems result in an insufficient performance improvement.

SUMMARY OF THE INVENTION

It is an object of the present invention to provide a semiconductor device having superior noise performance in which a reduced gate resistance is obtained by increasing the number of gate feeding points without an accompanying increase in the number of gate pads or in gate capacitance.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

According to an aspect of the present invention, a plurality of feeding points are provided on a gate finger extending on a substrate, and adjacent feeding points are connected by gate wiring positioned at a location over the gate finger with an air layer between the gate wiring and the gate finger, and the connection to the external gate pad is made at a portion of the wiring. Therefore, the crossing area of the gate wiring and the source electrode is suppressed to a minimum, and a reduction in the gate resistance is achieved without an increase in the gate capacitance, producing an FET having improved noise performance.

BRIEF DESCRIPTION OF THE DRAWINGS

FIG. 3 is a cross-sectional view of a portion of a conventional FET;

DETAILED DESCRIPTION OF THE PREFERRED EMBODIMENTS

Figure 1A:
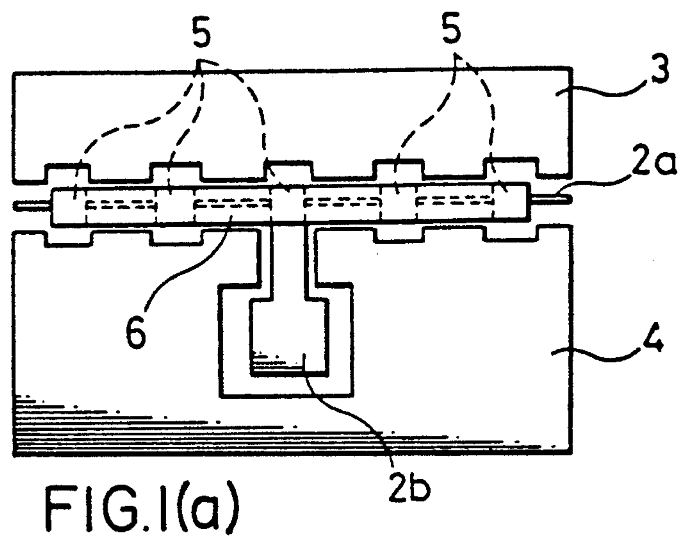
FIGS. 1(*a*) and 1(*b*) are a plan view and a perspective view, respectively, of a semiconductor device according to a first embodiment of the present invention.
Figure 1B:
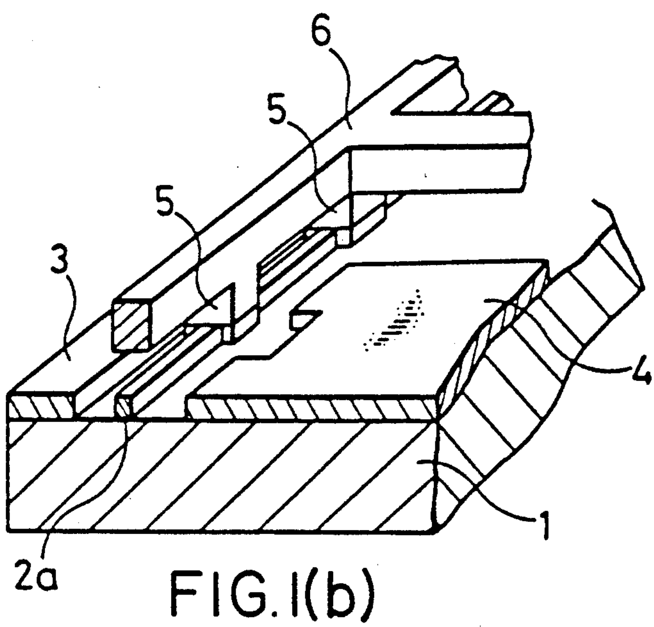

An FET according to a first embodiment of the present invention is shown in FIG. 1(*a*) in plan view and in FIG. 1(*b*) in a perspective view. In FIG. 1(*a*), there are provided five feeding points 5 on a gate finger 2*a*. The feeding points 5 are connected in an airbridge structure by a gate wiring 6 which is positioned above the gate finger 2*a* so that air is present between the gate wiring 6 and the gate finger 2*a* except at the feeding points 5.

The wiring 6 is connected to a gate pad 2*b* from a central one of feeding points 5.

An undoped intrinsic GaAs layer, an Si doped n-type AlGaAs layer, and an Si doped n-type GaAs layer are successively epitaxially grown on a compound semiconductor substrate 1, such as GaAs, by, for example, molecular beam epitaxy. Thereafter, a drain electrode 3, a source electrode 4, and a gate finger 2*a* are produced by deposition and lift-off on the surface of the substrate 1.

Next, a first photoresist is deposited on the entire substrate, covering the gate finger 2*a*, the source electrode 4, and the drain electrode 3. The first photoresist on the feeding points 5 of the gate finger 2*a* is removed by appropriate exposure to light and development.

Thereafter, a conductive layer, such as Ti/Au is deposited on the entire substrate by sputtering and a second photoresist is deposited on the conductive layer. The second photoresist at the gate wiring production portion on the gate finger 2*a* is removed by appropriate exposure to light and development.

Next, Au is deposited on the gate wiring production portion electrolytically, thereby producing a gate wiring 6.

Thereafter, the second photoresist is removed with an organic solvent. The conductive layer at the periphery of the gate wiring 6 is removed by dry etching, such as ion milling, and the first photoresist between the gate wiring 6 and the gate finger 2*a* is removed with an organic solvent, thereby completing the gate wiring 6 and the airbridge structure.

By connecting the gate wiring 6 thus produced with the gate pad 2*b* at the central feeding point 5, the structure shown in FIGS. 1(*a*) and 1(*b*) is produced.

Figure 6A:
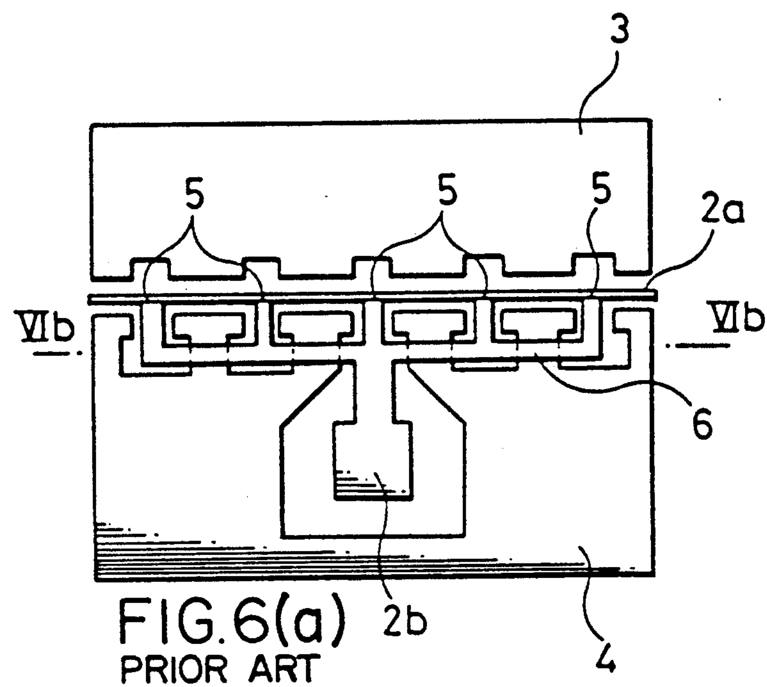
FIGS. 6(*a*) and 6(*b*) are a plan view and a cross-sectional view, respectively, of a prior art FET having a plurality of feeding points.
Figure 6B:
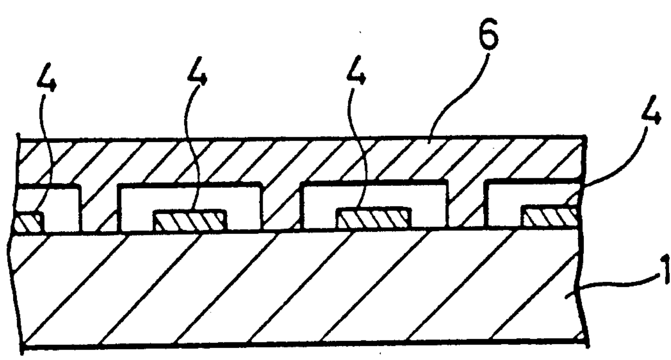
Figure 7A:
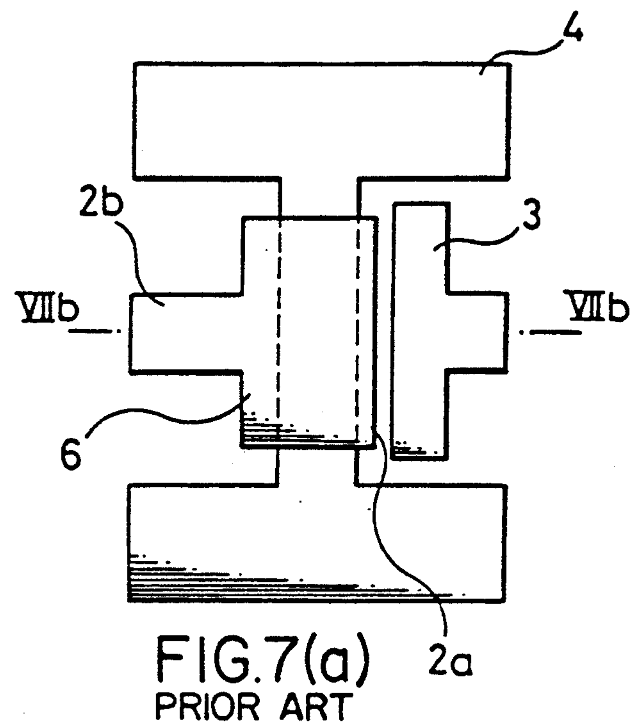
FIGS. 7(*a*) and 7(*b*) are a plan view and a cross-sectional view, respectively, of another prior art semiconductor device.
Figure 7B:
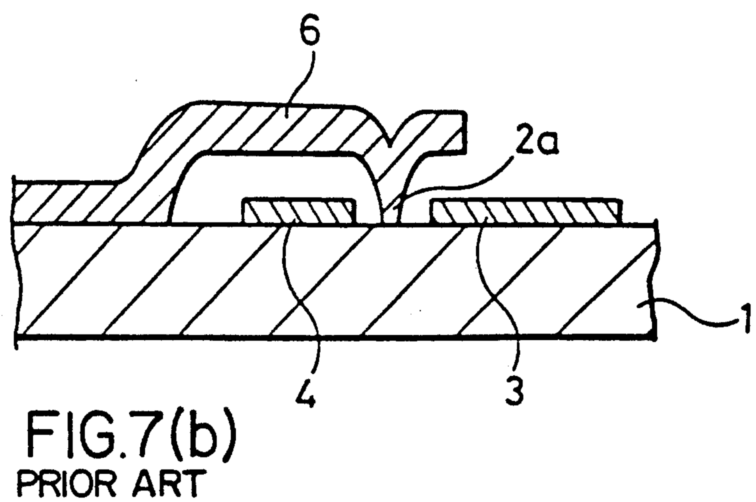

In this embodiment, the feeding points 5 of the gate finger 2*a* are connected with each other by the gate wiring 6 via the airbridge portion disposed directly above the gate finger 2*a* and a portion of the gate wiring 6 extends to the gate pad 2*b*. Therefore, even when a plurality of feeding points are provided, crossing of the gate wiring 6 and the source electrode 4 can be entirely avoided and gate resistance reduced without increasing the gate-to-source capacitance $C_{gs}$. By contrast, in the construction of the prior art device shown in FIGS. 6(*a*) and 6(*b*), the increase in the gate-to-source capacitance $C_{gs}$ caused by the crossing of the gate wiring 6 and the source electrode 4 that occurs when the number of feeding points is increased to 5 is 15%. On the other hand, in the invention, this area is reduced to 0% by removing the crossing of the gate wiring 6 and the source electrode 4, thereby improving the minimum noise figure $NF_{min}$ to 0.52 dB from 0.6 dB.

Figure 2A:
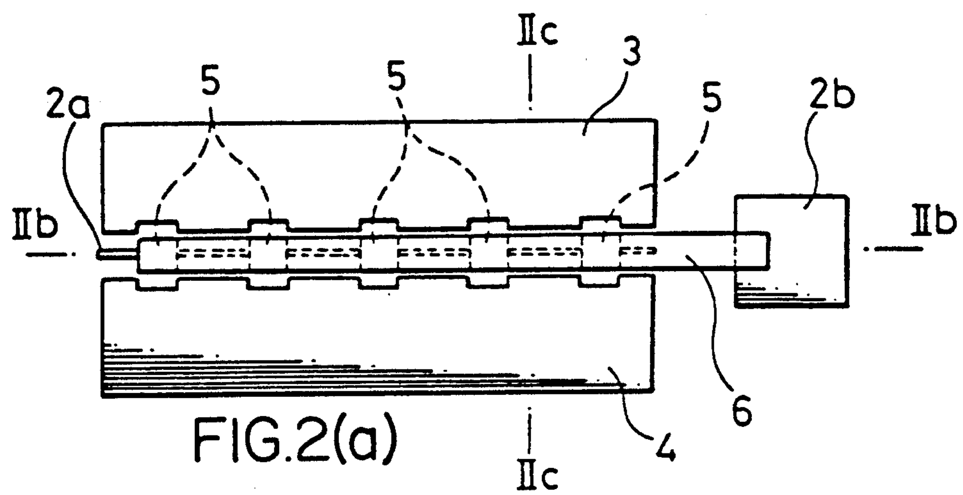
FIGS. 2(*a*) to 2(*c*) are a plan view and a cross-sectional view, respectively, of a semiconductor device according to a second embodiment of the present invention.
Figure 2B:
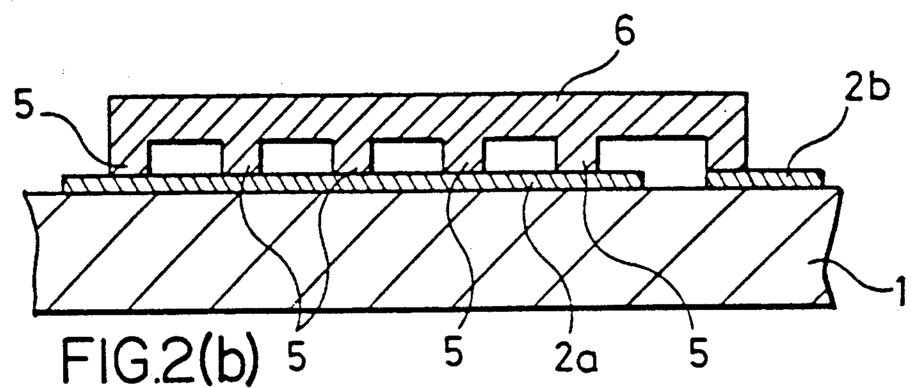
Figure 2C:
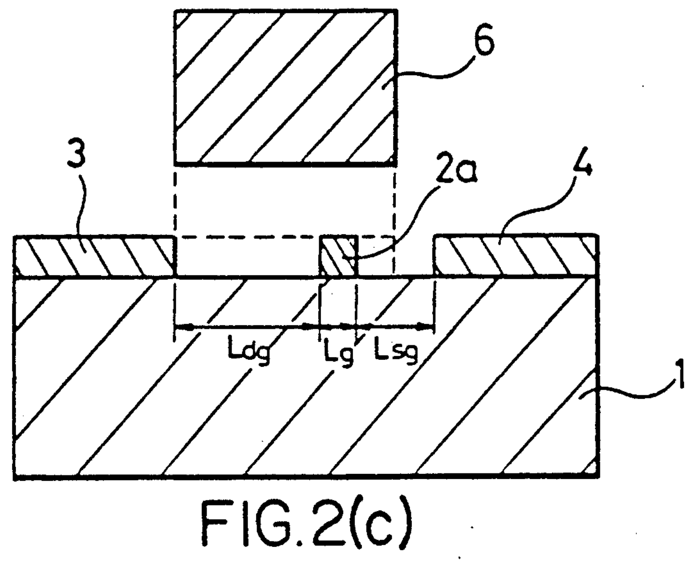
Figure 4:
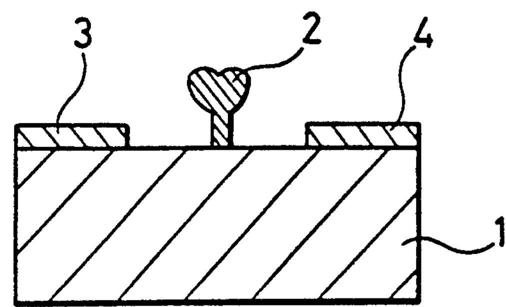
FIG. 4 is a cross-sectional view of a portion of a prior art FET having a T-shaped gate.
Figure 5:
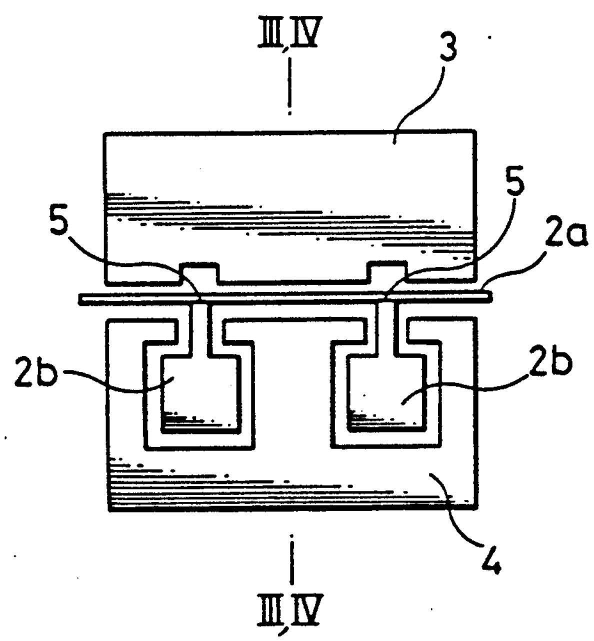
FIG. 5 is a plan view of a prior art FET.

An example of a semiconductor device according to a second embodiment of the present invention in which the connection of the gate pad is disposed at the end of the gate wiring is shown in FIG. 2(*a*) in a plan view and in FIG. 2(*b*) in cross-section taken along line IIb—IIb of FIG. 2(*a*). This embodiment is different from the first embodiment in the place where the external connection to the gate is made.

In this second embodiment in which the gate wiring 6 and the source electrode 4 do not cross each other, an increase in the gate capacitance is suppressed even when the number of feeding points is increased. Furthermore, the cross-sectional area of the gate wiring 6 is made much larger than that of the gate finger 2*a*, thereby effectively reducing $R_g$.

FIG. 2(*c*) is a schematic view showing an example of a cross-section taken along line IIc—IIc of FIG. 2(*a*).

This construction reduces the source series resistance $R_s$ and places the gate finger 2a closer to the source electrode 4 than the drain electrode 3, as shown in the figure. For example, the source-gate distance $L_{sg}$ is 1 micron, the gate length $L_g$ is 0.5 micron, and the drain-gate distance $L_{dg}$ is about 2 microns. In such a construction, the gate wiring 6 is closer to the drain electrode 3 and the gate wiring 6 is produced at a position spaced apart from the source electrode 4, thereby preventing an increase in capacitance. The gate wiring 6 of the present embodiment has a width of 3 microns and a height of 2 microns, and production of such wiring dimensions is easily realized by electrolytic plating, as described above.

While, in the above-described first and second embodiments, the connection of the gate wiring 6 to the gate pad 2b is made at the central portion or at the end of the gate finger 2a, the position of that connection is not restricted thereto in the present invention and the number of connecting electrodes is not restricted to one. In addition, the connecting electrode portion may not necessarily be wired through the air, as shown in FIG. 1(*b*).

In the above-illustrated embodiment, an HEMT is described, but the present invention is not restricted thereto and may be applied to all control electrode structures of a field effect transistor, such as a GaAs MESFET operating at high frequencies.

As is evident from the foregoing description, according to the present invention gate feeding points are connected directly with each other by airbridge wiring on the gate finger and, therefore, a reduction in the gate resistance due to provision of the multiple feeding points can be achieved without increasing the capacitance between the gate electrodes and the source electrodes, thereby enabling easy production of a semiconductor device with low noise characteristics.

What is claimed is:

1. A field effect transistor comprising:

a substrate containing a conductive region;

source and drain electrodes disposed on said substrate on said conductive region;

a gate finger electrode disposed on said substrate at the conductive region between said source and drain electrodes;

a gate pad disposed on the substrate beyond said source and drain electrodes for receiving and transmitting signals to and from said gate finger electrode;

a plurality of spaced apart feeding points disposed on said gate finger electrode for receiving and transmitting signals to and from said gate finger electrode; and an airbridge gate connection spaced from said substrate and electrically connected to each of said feeding points and to said gate pad.

2. The field effect transistor as defined in claim 1 wherein said gate connection does not cross the source or drain electrode.

3. The field effect transistor as defined in claim 1 wherein said gate connection is closer to the drain electrode than to the source electrode.

4. The field effect transistor as defined in claim 1 wherein the gate connection between said gate finger electrode and said gate pad is centrally disposed relative to said feeding points.

5. The field effect transistor as defined in claim 1 wherein the feeding points and gate finger electrode lie along a straight line, said gate pad is disposed at one end of the line, and the gate connection between said gate finger and said gate pad lies along the line.

6. The field effect transistor as defined in claim 1 wherein said substrate is GaAs and said gate finger electrode forms a Schottky barrier with the conducting region.

7. The field effect transistor as defined in claim 1 wherein said gate finger electrode is closer to the source electrode than to the drain electrode.

8. The field effect transistor as defined in claim 1 wherein the source and drain electrodes and conductive region are configured as a high mobility electron transistor.

* * * * *